(12) United States Patent
Iwata et al.

(10) Patent No.: US 8,102,046 B2
(45) Date of Patent: Jan. 24, 2012

(54) SEMICONDUCTOR DEVICE AND METHOD OF MANUFACTURING THE SAME

(75) Inventors: Yasuaki Iwata, Kanagawa (JP); Chihiro Sasaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/285,743

(22) Filed: Oct. 14, 2008

(65) Prior Publication Data

US 2009/0108438 A1 Apr. 30, 2009

(30) Foreign Application Priority Data

Oct. 26, 2007 (JP) .................................. 2007-278310

(51) Int. Cl.
*H01L 23/34* (2006.01)
(52) U.S. Cl. ................. 257/713; 257/712; 257/E23.103; 257/E23.105
(58) Field of Classification Search .................. 257/778, 257/783, 685, 713, E23.103
See application file for complete search history.

(56) References Cited

U.S. PATENT DOCUMENTS

| | | | | |
|---|---|---|---|---|
| 5,285,352 A | * | 2/1994 | Pastore et al. | 361/707 |
| 6,002,169 A | * | 12/1999 | Chia et al. | 257/697 |
| 6,650,009 B2 | * | 11/2003 | Her et al. | 257/686 |
| 6,835,897 B2 | * | 12/2004 | Chang et al. | 174/255 |
| 2006/0131724 A1 | * | 6/2006 | Sato et al. | 257/690 |

FOREIGN PATENT DOCUMENTS

| | | | | |
|---|---|---|---|---|
| JP | 6-314724 | | 11/1994 | |
| JP | 07-058239 | * | 3/1995 | ................. 257/680 |
| JP | 07058239 A | * | 3/1995 | ................. 257/680 |
| JP | 11-102937 | | 4/1999 | |
| JP | 2003-068804 A | | 3/2003 | |

OTHER PUBLICATIONS

Japanese Office Action dated Aug. 2, 2011 with an English translation.

* cited by examiner

*Primary Examiner* — Michael Lebentritt
*Assistant Examiner* — Daniel Whalen
(74) *Attorney, Agent, or Firm* — McGinn IP Law Group LLC

(57) ABSTRACT

Through heat discharge only by wiring connected to a conventional semiconductor chip, sufficient heat discharge performance may not be achieved in a recent semiconductor device. A semiconductor device according to an aspect of the present invention includes: a flexible substrate including a first main surface and a second main surface; a semiconductor chip; a first heat conductive layer formed on the first main surface of the flexible substrate and electrically connected to the semiconductor chip; and a second heat conductive layer formed on the second main surface of the flexible substrate and electrically insulated from the semiconductor chip.

5 Claims, 5 Drawing Sheets

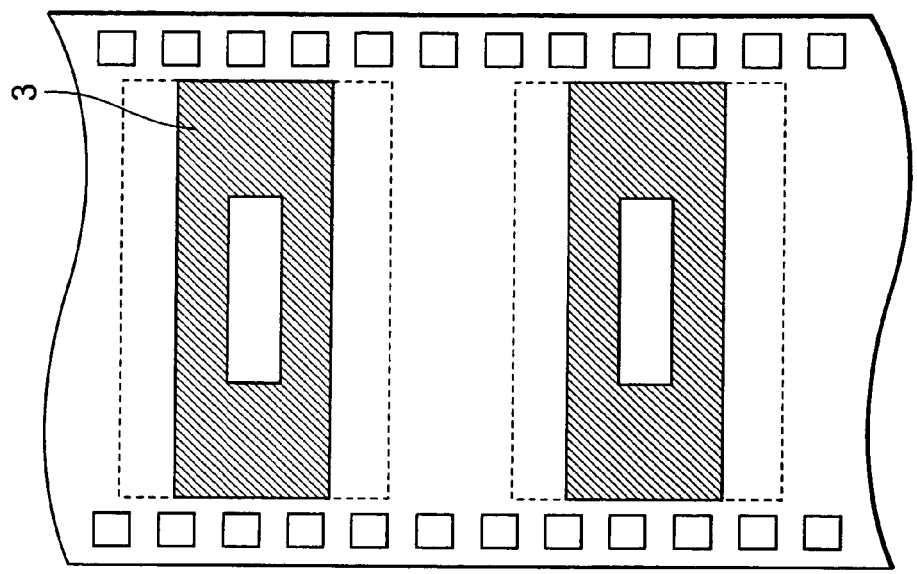
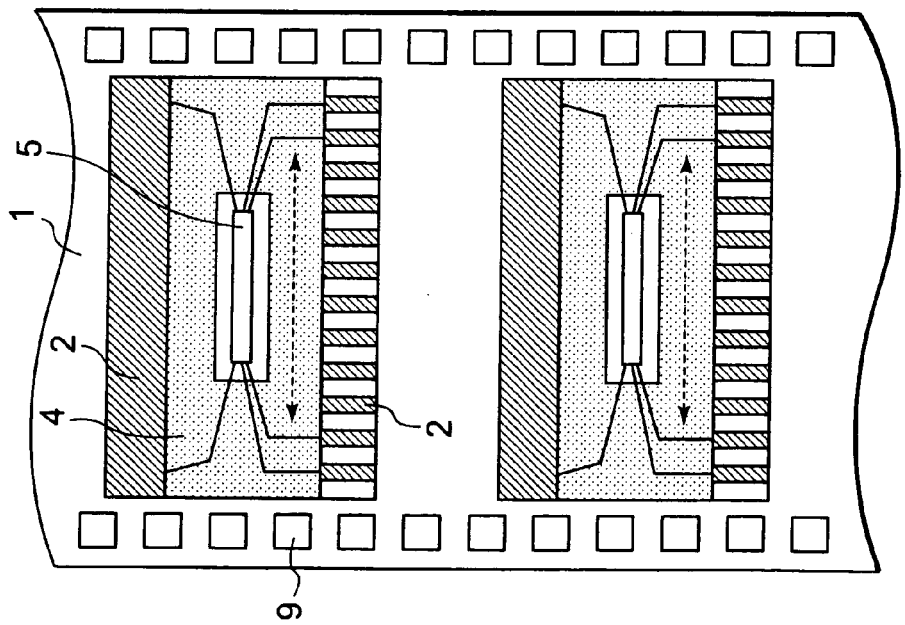

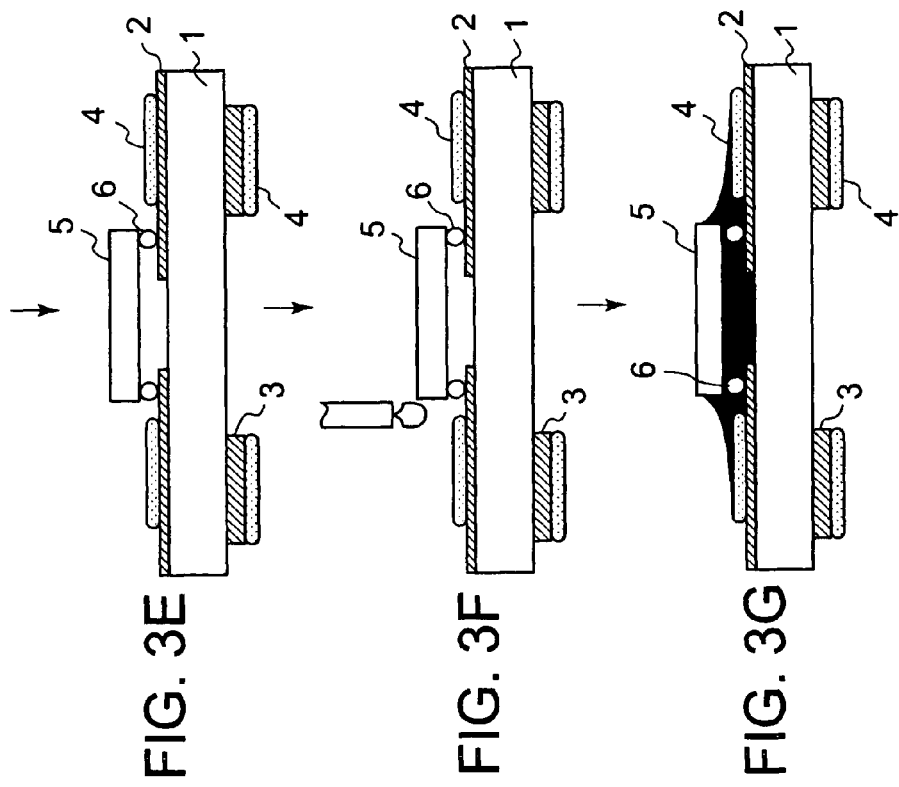
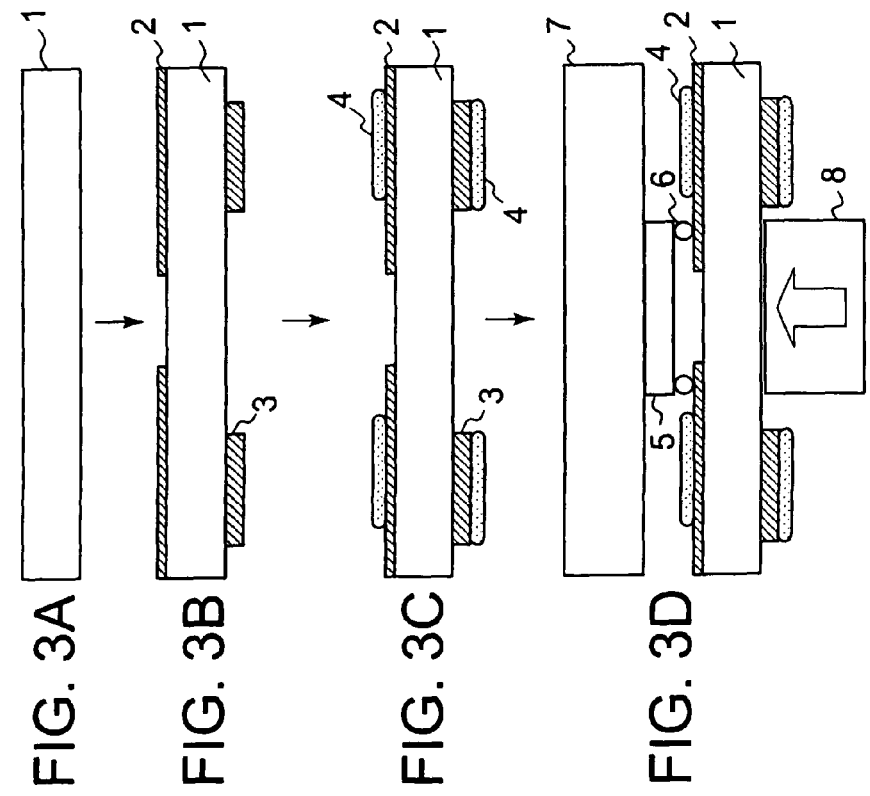

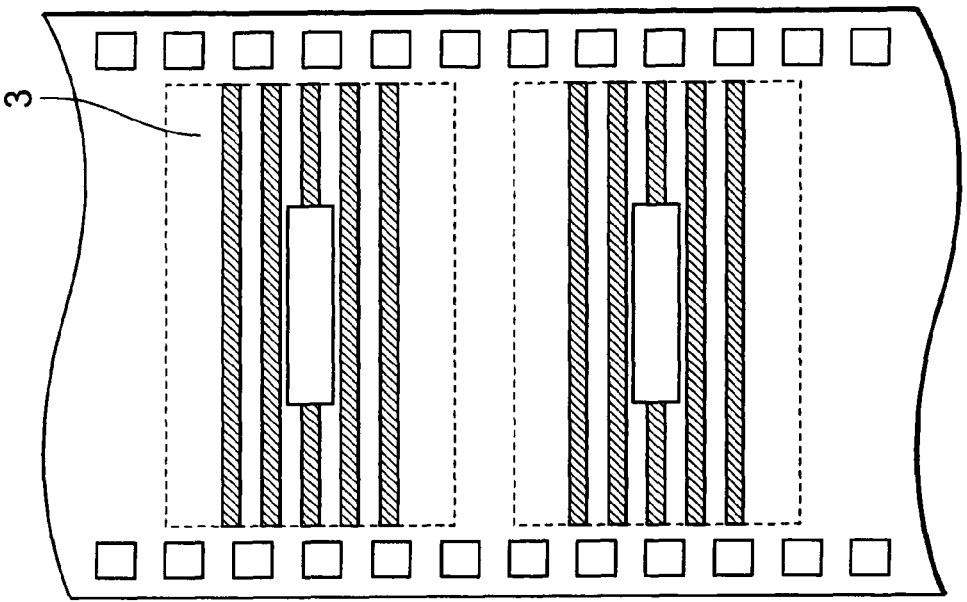
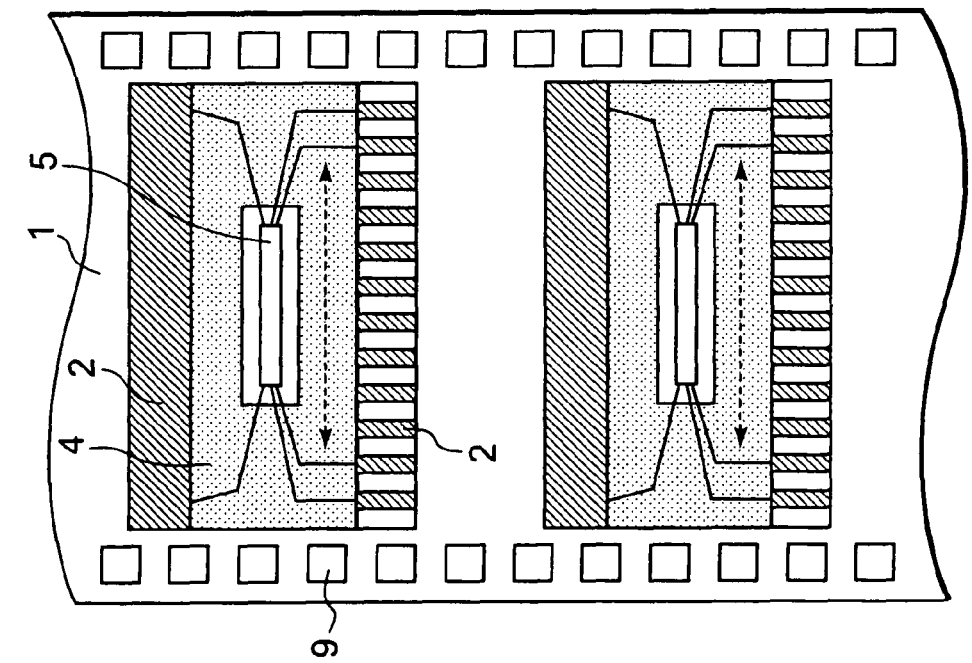

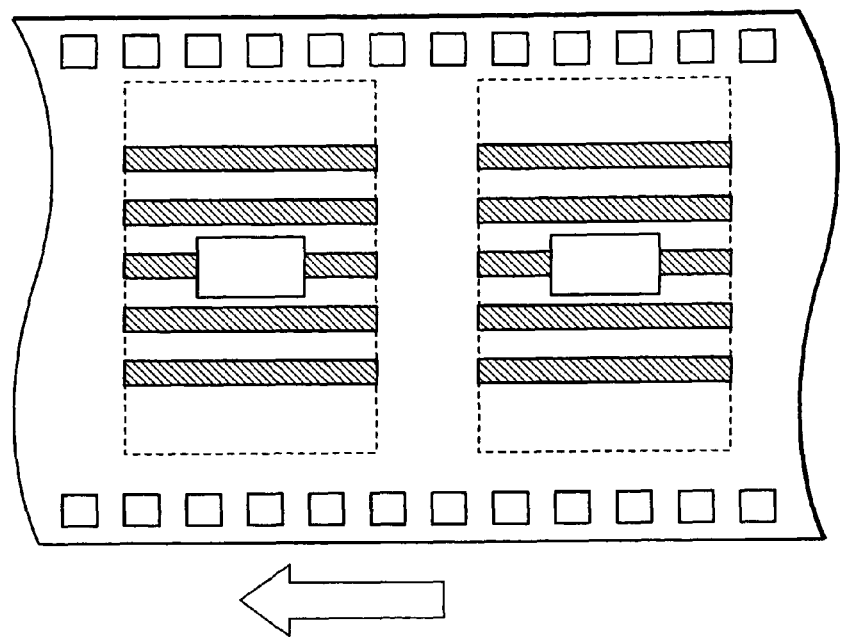
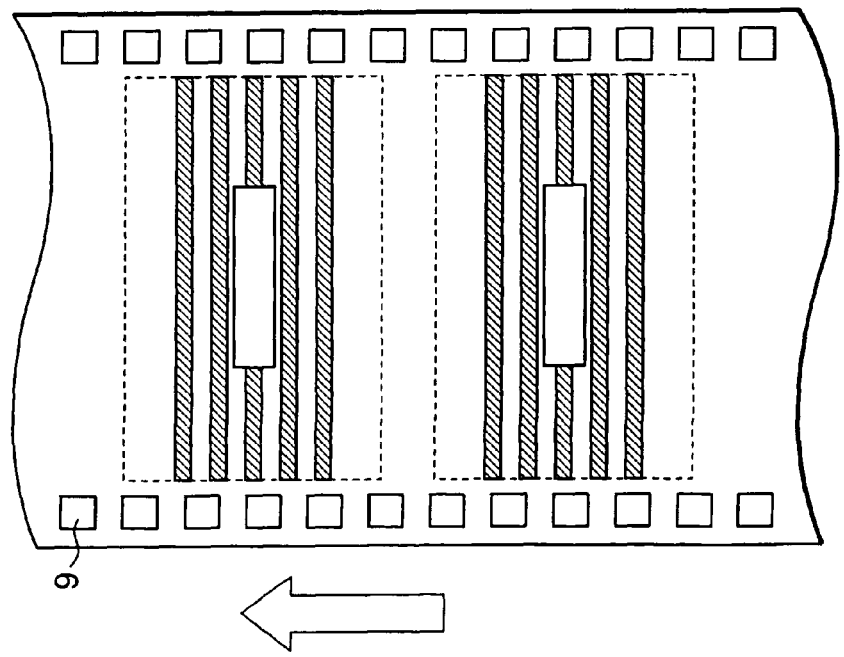

SEMICONDUCTOR DEVICE AND METHOD OF MANUFACTURING THE SAME

BACKGROUND OF THE INVENTION

1. Field of the Invention

The present invention relates to a semiconductor device, and more particularly, to a semiconductor device in which a semiconductor chip is mounted onto a flexible substrate.

2. Description of the Related Art

For example, there are known technologies called tape carrier package (TCP) and chip on film (COF) as technologies for mounting a semiconductor device in a liquid crystal display device. Along with development of highly-integrated or highly-functional ICs, JP 06-314724 A and JP 11-102937 A disclose a technology involving forming wiring on a back surface side of a flexible substrate via a via hole to improve flexibility in arrangement of lead wiring in the TCP or the COF.

On the other hand, along with the increase in operating speed for a semiconductor device, an amount of heat radiated from a semiconductor chip is also becoming gradually larger. For that reason, in recent years, even in a semiconductor device including a semiconductor chip arranged on a flexible substrate such as the TCP, a semiconductor device having an excellent heat discharge function has been required.

Conventionally, in the semiconductor device including the semiconductor chip arranged on the flexible substrate, heat radiated from the semiconductor chip is discharged by using a wiring layer connected to the semiconductor chip. However, through the heat discharge only by the wiring connected to the semiconductor chip, sufficient heat discharge performance may not be achieved in the recent semiconductor device.

As described above, through the heat discharge only by the wiring connected to the conventional semiconductor chip, the sufficient heat discharge performance may not be achieved.

SUMMARY OF THE INVENTION

A semiconductor device according to an aspect of the present invention includes: a flexible substrate including a first main surface and a second main surface; a semiconductor chip; a first heat conductive layer formed on the first main surface of the flexible substrate and electrically connected to the semiconductor chip; and a second heat conductive layer formed on the second main surface of the flexible substrate and electrically insulated from the semiconductor chip.

Further, a semiconductor device according to another aspect of the present invention includes: a flexible substrate including a first main surface and a second main surface; a plurality of semiconductor chips arranged on the flexible substrate in a row; a first heat conductive layer formed on the first main surface of the flexible substrate and electrically connected to the plurality of semiconductor chips; and a second heat conductive layer formed on the second main surface of the flexible substrate and electrically insulated from the plurality of semiconductor chips, in which the second heat conductive layer includes long side portions in a direction intersecting with a row direction of the plurality of semiconductor chips.

Still further, a method of manufacturing a semiconductor device according to further another aspect of the present invention includes: forming a first heat conductive layer on a first main surface of a flexible substrate to be electrically connected to a semiconductor chip; forming a second heat conductive layer on a second main surface of the flexible substrate to be electrically insulated from the semiconductor chip; arranging the semiconductor chip on the first heat conductive layer; and sealing with a resin at least a portion of the first heat conductive layer and the semiconductor chip.

According to the present invention, the heat discharge performance of a semiconductor package can be improved.

BRIEF DESCRIPTION OF THE DRAWINGS

In the accompanying drawings:

FIGS. 2A and 2B show the semiconductor device according to First Embodiment of the present invention;

FIGS. 3A, 3B, 3C, 3D, 3E, 3F, and 3G show a manufacturing process of the semiconductor device according to First Embodiment of the present invention;

FIGS. 4A and 4B show a semiconductor device according to Second Embodiment of the present invention; and FIGS. 5A and 5B show a relationship between a back surface of the semiconductor device and a film feed direction according to Second Embodiment of the present invention.

DETAILED DESCRIPTION OF THE PREFERRED EMBODIMENTS

First Embodiment

Figure 1:
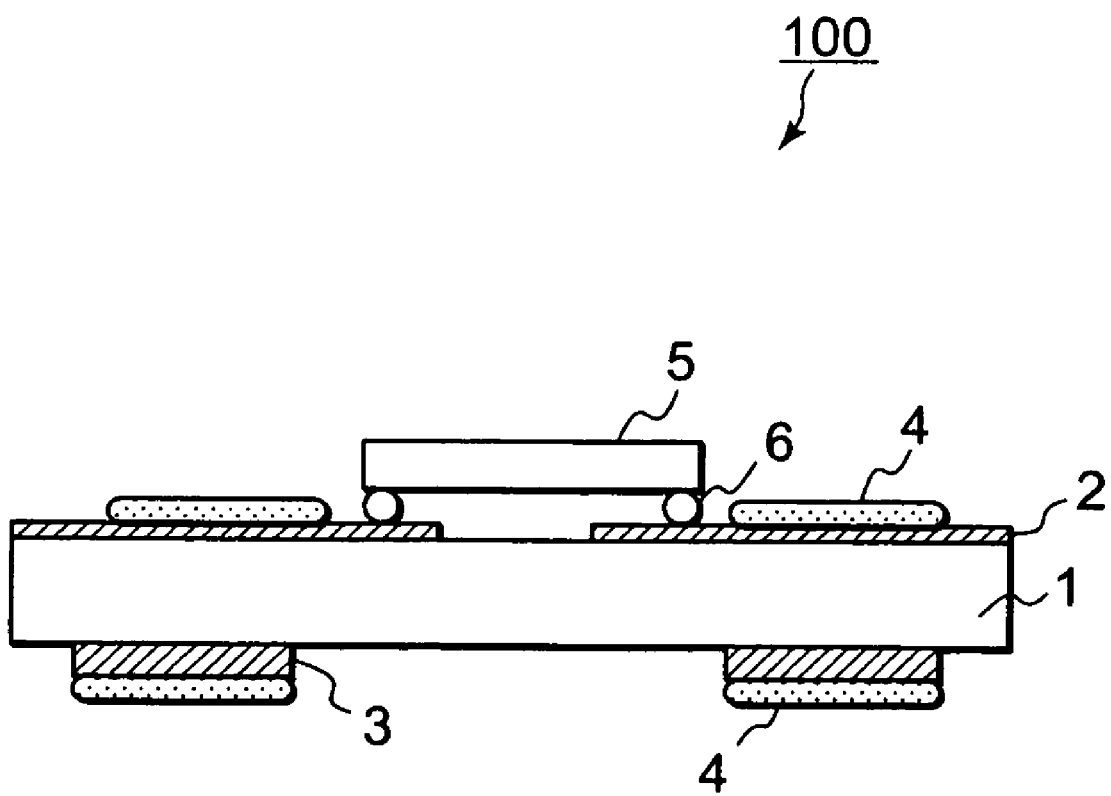
FIG. 1 shows a cross section of a semiconductor device according to First Embodiment of the present invention.

Hereinafter, embodiments of the present invention are described with reference to the drawings. FIG. 1 is a cross section of a semiconductor device (hereinafter, referred to as TCP) 100 according to First Embodiment of the present invention. As shown in FIG. 1, the TCP 100 of this embodiment includes a flexible substrate (hereinafter, also referred to simply as substrate) 1, a first heat conductive layer (hereinafter, referred to as first conductive pattern) 2, a second heat conductive layer (hereinafter, referred to as second conductive pattern) 3, a solder resist 4, a semiconductor chip 5, and an electrode 6.

The flexible substrate 1 has insulating property and flexibility. For example, a tape-like film formed of a polyimide resin is used as the flexible substrate.

The first conductive pattern 2 is formed on a first main surface (hereinafter, referred to as front surface) of the substrate 1. The first conductive pattern 2 is formed of an electrical conductor such as a copper foil. The first conductive pattern 2 includes an inner lead portion connected to an electrode of the semiconductor chip 5, an outer lead portion connected to an external element, and a wiring portion connecting the inner lead portion and the outer lead portion. As the first heat conductive layer, any layer which is plated with a conductive material on a surface thereof in order to prevent oxidation of the wiring may be prepared.

The second conductive pattern 3 is formed on a second main surface (hereinafter, referred to as back surface) of the substrate 1. In this embodiment, the second conductive pattern 3 is formed of an electrical conductor such as a copper foil. Further, the second conductive pattern 3 is not formed on a region where a semiconductor chip is mounted on a front surface side, and where the substrate 1 is exposed. The second heat conductive layer 3 is electrically insulated from the semiconductor chip mounted onto the front surface.

The solder resist 4 is formed on the first conductive pattern 2 and the second conductive pattern 3 except for the region where the semiconductor chip is mounted. The solder resist 4 is a coating film having insulating property and has a function of leak prevention of a sealing resin described below. In addition, the solder resist 4 has also an effect of preventing deformation, because the surroundings of the flexible substrate or conductive pattern portions are reinforced.

The semiconductor chip 5 has an integrated circuit formed therein. An inner circuit thereof and the first conductive pattern 2 are electrically connected to each other via the electrode 6 formed on the semiconductor chip 5.

FIGS. 2A and 2B are views showing the front surface and the back surface of the substrate 1 described above. A plurality of the TCPs 100 are formed to be arranged on a film in a row or in matrix, and are divided to obtain individual semiconductor devices. Therefore, sprocket holes 9 are provided to both sides of each TCP. The sprocket hole 9 is provided for the purpose of a film feed for a case where a device assembly is successively performed.

As described above, the first conductive pattern 2 and the second conductive pattern 3 are formed on both sides of the substrate 1. The first conductive pattern 2 is electrically connected to the semiconductor chip, and the second conductive pattern 3 is electrically insulated from the semiconductor chip. Providing the conductive pattern as the heat conductive layer on the back surface side of the TCP in this manner allows thermal resistance to be reduced compared with a case where the back surface side is provided with nothing and heat is discharged to the air from a surface of the polyimide resin. As a result, the heat discharge performance of the TCP is improved, whereby the possibility that a mounted chip causes thermal breakdown or the like can also be reduced.

Further, the second conductive pattern 3 is formed excluding a portion corresponding to the region where the semiconductor chip 5 is mounted. In a case where the semiconductor chip is mounted on the film with the above-mentioned structure, a bonding tool can be directly brought into contact with the film. In general, when the semiconductor chip is mounted, the bonding tool is used in a heated state. In a case where bonding is performed in a state where the second conductive pattern 3 is formed on the entire back surface, heat of the bonding tool is partially discharged via the second conductive pattern 3. Therefore, the conductive pattern of the region where the semiconductor chip is mounted is removed to thereby prevent heat discharge of the bonding. Thus, the semiconductor chip can be efficiently mounted.

FIGS. 3A to 3G are views showing a method of manufacturing the TCP as configured above. Hereinafter, a method of manufacturing the TCP of this embodiment is described with reference to FIGS. 3A to 3G. First, a conductive layer is formed on a film which becomes a substrate. The conductive layer is patterned into a predetermined shape by a known photolithography process or etching process (see FIGS. 3A and 3B). In FIGS. 3A to 3G, the front surface and the back surface of the film are formed with the conductive layers at the same time. For example, after the formation of the conductive layer on the front surface, the same process may be repeated for the back surface to form the conductive layer of the back surface side.

In order to attach the above-mentioned electrical conductor such as a copper foil to a base film 1, for example, an adhesive is used (not shown). As the adhesive, for example, a thermosetting epoxy adhesive having excellent adhesiveness and heat resistance is used.

After that, the solder resist 4 is formed on the first and second conductive patterns except for the region where the semiconductor chip 5 is mounted (see FIG. 3C). Then, the semiconductor chip 5 is mounted onto the TCP 100.

Specifically, the electrode 6 of the semiconductor chip 5 and an inner lead of the first conductive pattern of the TCP are connected to each other. In this case, the inner lead is connected to the semiconductor chip mounted to a semiconductor package, for example, via a bump electrode. The process of connecting the conductive portion of the TCP to a connecting portion of the semiconductor chip can be implemented by, for example, inner lead bonding. In this case, for example, after a connection portion of a semiconductor element which is set on a bonding stage 7 is aligned with the conductive portion of the TCP, a bonding tool 8 is pressed against the TCP under a heating condition to perform connections at a plurality of portions in a short time (see FIG. 3D).

Then, as the final process, the semiconductor chip and the inner lead are sealed with a resin so as to be encompassed in order to protect the semiconductor chip and the inner lead from humidity of surrounding environments, contamination, and the like. As the sealing resin, for example, the epoxy resin is used (see FIG. 3F). In this manner, the semiconductor device 100 is completed (see FIG. G).

As described above, in this embodiment, the first conductive pattern 2 which is electrically connected to the semiconductor chip 5, and the second conductive pattern 3 which is electrically insulated from the semiconductor chip 5 are formed. Providing the conductive pattern as the heat conductive layer on the back surface side of the TCP allows thermal resistance to be reduced compared with a case where the back surface side is provided with nothing and heat is discharged to the air from the surface of the polyimide resin. As a result, the heat discharge performance of the TCP is improved, whereby the possibility that a mounted chip causes thermal breakdown or the like can also be reduced.

Further, in the semiconductor device 100 shown in this embodiment, the second conductive pattern 3 is a heat conductive layer which is formed for the purpose of heat discharge. Therefore, the first conductive pattern 2 and the second conductive pattern 3 need not to be electrically connected to each other via a through hole, and thus the substrate 1 need not to be formed with a through hole. The second conductive pattern 3 may be formed in just the same way as the first conductive pattern 2 without performing a process of forming the through hole. Accordingly, a manufacturing process of the semiconductor device 100 is made simpler than that of the TCP disclosed in JP 06-314724 A or JP 11-102937 A, which is formed with a conductor on a back surface thereof as a wiring pattern.

Second Embodiment

FIG. 1 is a view showing a cross section of a semiconductor device 200 of this embodiment, similarly to First Embodiment. FIGS. 4A and 4B show a front surface onto which the semiconductor chip 5 is mounted and a back surface, which is opposite to the front surface onto which the semiconductor chip 5 is mounted, respectively. Note that, in FIGS. 4A and 4B, the same configuration as in FIGS. 2A and 2B are denoted by like reference numerals, and detailed description thereof is omitted. In FIGS. 4A and 4B, the second conductive pattern 3 of the TCP in the semiconductor device 100 shown in FIG. 2B is formed into a stripe shape. The stripe shape is formed in a direction in which a plurality of the conductive patterns including long side portions and short side portions are arranged in the direction along long side portions of the semiconductor chip 5.

Such a stripe shape can be formed by performing etching on the copper foil formed on the back surface of the substrate 1. Further, the stripe shape formed on the back surface of the TCP is formed excluding the portion corresponding to the region where the semiconductor chip 5, which is formed on the front surface of the substrate 1, is mounted.

FIGS. 5A and 5B are views showing orientation of the stripe shape with respect to the film feed direction. In the TCP shown in FIG. 5A, the stripe shape extends in a direction perpendicular to the film feed direction. In the TCP shown in FIG. 5B, the stripe shape extends in the same direction as in the film feed direction.

As described above, in the case where the second conductive pattern 3 is formed in a stripe shape, the flexibility as the flexible substrate 1 can be improved. In a case where only the flexibility is taken into consideration, any of the orientations of the stripe shape with respect to the film feed direction may be selected. However, in a case where a film rewinding direction is taken into consideration, the stripe shape formed on the back surface of the TCP is preferred to extend in the direction perpendicular to the film feed direction. Further, when the semiconductor chip to be mounted includes the long side portions and the short side portions, the stripe shape is provided along the direction of the long side portions, with the result that the flexibility can be improved while the strength of the long-side-portion direction of the semiconductor chip can be maintained.

As described above, in this embodiment, the second conductive pattern 3 formed on the back surface of the TCP is formed into a stripe shape. The second conductive pattern 3 is formed into the stripe shape, whereby the flexibility of the TCP can be improved. Further, a surface area of the second conductive pattern 3 is increased, whereby heat discharge performance is more improved. In addition, the second conductive pattern 3 is formed excluding the portion corresponding to the region where the semiconductor chip 5 is mounted. In a case where the semiconductor chip 5 is mounted onto the film with such a structure, the bonding tool can be directly brought into contact with the film. Therefore, the heat due to bonding is not discharged when the conductive patterns of the region where the semiconductor chip 5 is mounted are removed, and the semiconductor chip can be efficiently mounted.

Hereinbefore, the embodiments of the present invention have been described, in which various modifications can be made as long as the modifications do not depart from the gist of the present invention. In the embodiments of the present invention, a heat discharge surface is formed on the back surface of the flexible substrate with a conductive pattern, the heat discharge surface discharging heat generated in the semiconductor chip. However, if the object is heat discharge, a special ceramic pattern which converts heat into red infrared rays to be discharged may be formed on the back surface of the flexible substrate. Further, in Second Embodiment, the second conductive pattern 3 is made in a stripe shape. However, if increasing the surface area of the second conductive pattern 3 can contribute to the improvement of the heat discharge performance, the stripe shape is not necessarily provided, and various shapes can be employed.

What is claimed is:
1. A semiconductor device, comprising:
a flexible tape substrate including a first main surface and a second main surface;
a semiconductor chip;
a first heat conductive layer formed on the first main surface of the flexible tape substrate and electrically connected to the semiconductor chip; and
a second heat conductive layer which comprises a plurality of divided conductive stripe patterns formed on the second main surface of the flexible tape substrate and electrically insulated from the semiconductor chip,
wherein the second heat conductive layer is formed on the second main surface of the flexible tape substrate excluding a portion just underlying an entire region where the semiconductor chip is mounted on the first main surface of the flexible tape substrate in a plan view of the device.
2. The semiconductor device according to claim 1, wherein the semiconductor chip is formed into a rectangular shape including a long side portion and a short side portion, and
wherein each of the plurality of divided conductive stripe patterns is provided along a direction of the long side portion.
3. The semiconductor device according to claim 1, further comprising a first solder resist formed on an outer surface of the second heat conductive layer.
4. The semiconductor device according to claim 3, further comprising a second solder resist formed on an outer surface of the first heat conductive layer.
5. A semiconductor device, comprising:
a flexible tape substrate including a first main surface and a second main surface;
a plurality of semiconductor chips arranged on the flexible substrate in a row;
a first heat conductive layer formed on the first main surface of the flexible substrate and electrically connected to the plurality of semiconductor chips; and
a second heat conductive layer which comprises a plurality of divided conductive stripe patterns formed on the second main surface of the flexible tape substrate and electrically insulated from the plurality of semiconductor chips,
wherein each of the plurality of divided conductive stripe patterns is provided along a row direction of the plurality of semiconductor chips, and
wherein the second heat conductive layer is formed on the second main surface of the flexible tape substrate excluding a portion just underlying an entire region where the semiconductor chip is mounted on the first main surface of the flexible tape substrate in a plan view of the device.

* * * * *